(12) United States Patent
Bender

(10) Patent No.: US 6,373,212 B1
(45) Date of Patent: Apr. 16, 2002

(54) ELECTRIC CONNECTOR

(75) Inventor: Günther Bender, Rodheim (DE)

(73) Assignee: Mannesmann VDO AG, Frankfurt (DE)

(*) Notice: Subject to any disclaimer, the term of this patent is extended or adjusted under 35 U.S.C. 154(b) by 0 days.

(21) Appl. No.: 09/582,960

(22) PCT Filed: Dec. 28, 1998

(86) PCT No.: PCT/EP98/08481

§ 371 Date: Sep. 6, 2000

§ 102(e) Date: Sep. 6, 2000

(87) PCT Pub. No.: WO99/35712

PCT Pub. Date: Jul. 15, 1999

(30) Foreign Application Priority Data

Jan. 10, 1998 (DE) .......................................... 198 00 707

(51) Int. Cl.$^7$ ................................................. H02P 1/04
(52) U.S. Cl. ........................ 318/443; 318/444; 318/483
(58) Field of Search ................................ 318/440–469, 318/470, 483, DIG. 2; 307/9.1, 10.1, 10.8; 15/250.17, 250.16; 338/202, 162, 165, 167

(56) References Cited

U.S. PATENT DOCUMENTS

| | | | |
|---|---|---|---|
| 3,585,570 A | | 6/1971 | Jans |
| 3,694,723 A | * | 9/1972 | Schneider et al. |
| 4,259,624 A | * | 3/1981 | Seibicke |
| 4,639,065 A | * | 1/1987 | Kohler et al. |
| 4,700,026 A | * | 10/1987 | Kamiyama et al. |
| 4,733,147 A | * | 3/1988 | Muller et al. |
| 4,810,994 A | * | 3/1989 | Froebe et al. |
| 5,063,317 A | * | 11/1991 | Bruhn |
| 5,131,362 A | | 7/1992 | Simon |
| 5,481,141 A | | 1/1996 | Brown |
| 5,672,818 A | | 9/1997 | Schaefer |
| 5,764,010 A | * | 6/1998 | Maue et al. |
| 5,990,586 A | * | 11/1999 | Milano, Jr. |
| 6,111,378 A | * | 8/2000 | LeMay et al. |

FOREIGN PATENT DOCUMENTS

| | | |
|---|---|---|
| DE | 1920061 | 9/1963 |
| DE | 2841443 | 4/1980 |
| DE | 3024945 | 1/1982 |
| DE | 9007074 | 9/1990 |
| DE | 4139550 | 6/1993 |
| DE | 4416776 | 12/1994 |
| DE | 19518431 | 11/1996 |
| DE | 19539584 | 4/1997 |
| EP | 0596392 | 5/1994 |
| WO | 9534106 | 12/1995 |

OTHER PUBLICATIONS

Günter Gilz and Andreas Wokan "Elektronisches Gaspedal Für Nutzfahrzeuge" Automobil technische Zeitschrift 95, 1993, p. 80–88.

JP 09180780 A., Patent Abstracts of Japan, published Jul. 11, 1997.

* cited by examiner

Primary Examiner—Paul Ip
(74) Attorney, Agent, or Firm—Martin A. Farber

(57) ABSTRACT

An electrical connection between a potentiometer, an actuating motor and control electronics for controlling an actuating element has heretofore been composed of electrical cables, so that a large number of contact points were necessary overall, whereby however, each additional contact point increased the risk of a fault and made the assembly process more expensive. In order to reduce the number of contact points, the base substrate of the potentiometer and the contact board of the motor are in the form of an integral board, and at least some of the electrical connections comprise conductor tracks embedded in the substrate. Electrical components, such as a motor inductor for radio interference suppression, may also be mounted on the board.

6 Claims, 1 Drawing Sheet

ELECTRIC CONNECTOR

FIELD AND BACKGROUND OF THE INVENTION

The invention relates to an electrical connection between a potentiometer for detecting the actual position of an actuating element, a motor for operating the actuating element, and control electronics for controlling the nominal/actual value correction.

Such an electrical connection is required, for example, in so-called E-gas systems in motor vehicles. The potentiometer is in this case coupled to the engine throttle valve shaft, which can be rotated by operation of the actuating motor. The control electronics in this case compare the nominal value of the throttle valve position, governed by the gas pedal position, with the actual value determined by the potentiometer and, if necessary, carries out corrective measures by driving the actuating motor. The electrical components of the control loop have until now been connected to one another via cables, thus necessitating a large number of contact points. Apart from rigid links produced, for example, by welding or soldering, the contact points comprise connections or plug connections produced by crimping. The risk of contact problems increases with each additional contact point, however, irrespective of the design configuration. In the case of rigid connections, there is a risk of these connections being destroyed over a period of time as a result of the materials which are connected to one another having different thermal coefficients of expansion, in the event of temperature fluctuations, such as those which occur to a significant extent in the engine compartment of a motor vehicle. In the case of other types of connection, problems occur due to oxidation of the contact surfaces, or the contact resistances between the contact surfaces are very high owing to mechanical prestressing of the two contact partners being too low from the start or decreasing during use. It is also necessary to take account of the fact that the current carrying capacity of such connections is reduced under the influence of high temperatures (derating curve).

The production of contact points also requires a large number of processes, some of which can be automated only with difficulty and each of which intrinsically involves the risk of a process fault. A further disadvantage of mechanical connections is that the cables, plug sockets and plug housings represent components which are sensitive to vibration and which can become loose over a period of time, particularly with the vibration which is always present in the engine region of motor vehicles.

SUMMARY OF THE INVENTION

The object of the invention is to avoid the contact points required for an electrical connection of the type mentioned above, and thus to improve the reliability and to reduce the manufacturing costs.

According to the invention, the object is achieved by an electrical connection of the introduction mentioned type in which the base substrate of the potentiometer and the contact board of the motor are in the form of an integral board, and at least some of the electrical connections comprise conductor tracks embedded in the substrate.

This allows a large number of contact points to be avoided. The risk of faults during the production of the electrical connection is reduced by the conductor tracks embedded in the substrate. The electrical connection according to the invention has also been found to be highly resistant to vibration and temperature fluctuations. For example, the motor and the potentiometer can be connected to the control electronics via a single plug connection on the board. This avoids separate wiring for the potentiometer and motor.

In a further refinement, the invention provides for at least some of the electrical components of the control loop which comprises the potentiometer, motor and control electronics to be integrated on the board.

For example, inductors, brush braided-wire contacts and printed discharge resistors can be provided in the region of the motor. The potentiometer tracks are also preferably applied directly to the board by printing, and are connected to the embedded conductor tracks. These measures allow the previously required numbers of contact points to be reduced further.

In addition to a contact point for connection of the control electronics, further connecting points can be provided for motor contact tabs. As an alternative to the motor contact point, it is possible to design the board to have brush guide channels directly in the region of the motor.

In a preferred development of the invention, openings are provided at the contact points, into which openings the conductor tracks project elastically in the form of tongues from at least two opposite sides, with the distance between the ends of the contact tongues being less than the diameter or the width of the contact pin to be inserted or of the contact tab to be inserted.

Despite the simple insertion of the pins or contact tabs, this type of contact leads to a very good electrical connection, since the elastic tongues are first of all bent elastically by the contact pins, and their edges then subsequently make resilient contact with the surface of the contact pin. The very high surface pressure that results in this way ensures that a good electrical contact is made, with a low contact resistance. Since any tension applied to the contact pin increases the contact force between the conductor track tongues and the pin surface, such a connection at the same time forms reliable protection against the plug becoming loose due to vibration. On the other hand, material expansion resulting from different thermal influences does not lead to the connection being destroyed, since the contact tongues of the conductor tracks have a certain elasticity.

Since the conductor tracks are subject to different requirements in the different regions of the board, a further preferred embodiment of the invention provides for the conductor tracks to be composed of different materials in their individual regions. Thus, in the region of the already described contact point, the conductor track may be composed of a resilient material which ensures long-term elastic contact with the inserted contact pin.

The board may have a weak point between the motor region and the potentiometer region, with the conductor tracks which connect the two parts being exposed and flexible in the region of the weak point.

The embodiment with the weak point allows the motor board to be loosened before the rest of the board is actually fitted, thus allowing better matching to the physical characteristics. The electrical connection between the two board parts is not affected by this. Apart from compensating for tolerances, the motor can also be arranged inclined with respect to the potentiometer, or at right angles to it, in which case, however, it is necessary to ensure that the exposed conductor tracks can be deformed sufficiently.

BRIEF DESCRIPTION OF THE DRAWING

An exemplary embodiment of the invention will be described in more detail in the following text with reference to the attached drawing, in which.

DETAILED DESCRIPTION OF THE PREFERRED EMBODIMENT

Figure 1:
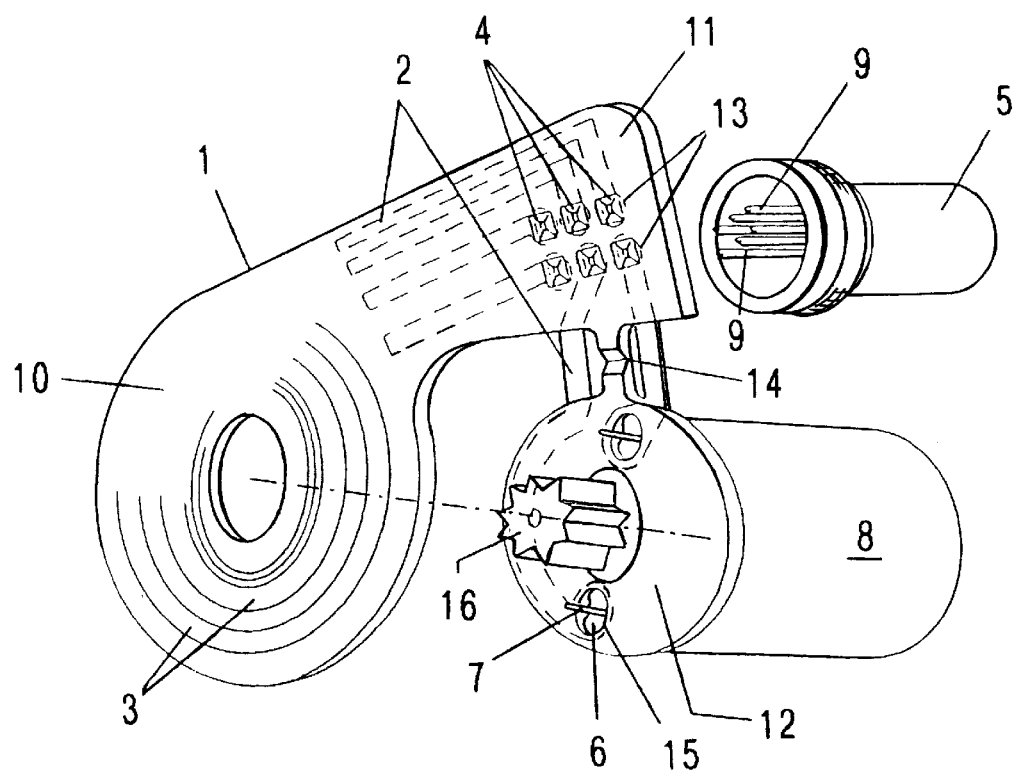
FIG. 1 shows an oblique view of an electrical connection in the form of a board.

FIG. 1 shows a motherboard 1 which has conductor tracks 2 incorporated in its substrate layer, and thus forms an electrical connection between tracks 3 of a potentiometer (not shown), plug contacts 4 for insertion of a plug 5, and plug contacts 6 for insertion of contact tabs 7 of a motor 8. The contact pins 9 of the plug 5 connect the plug contacts 4 of the conductor tracks 2 to control electronics (not shown) which operate an actuating element (not shown) on the basis of a preset value, via the motor 8. The potentiometer is used to detect the actual position of the actuating element, so that the control electronics can carry out an actual/nominal value correction, and can readjust the motor 8, if necessary. Such a control loop is used, for example, in so-called E-gas systems in motor vehicles, in which the throttle valve in the induction manifold of the engine is operated electronically, as an actuating element, depending on the gas pedal position.

The motherboard 1 is essentially broken down into three regions 10, 11, 12. The first region 10 corresponds essentially to the substrate of a potentiometer on whose surface the tracks 3 are printed. The second region 11, which should be referred to as the contact region, is integrally formed at the side of the first region 10. The conductor tracks 2 are embedded in the substrate layer of the motherboard 1 as an inserted assembly with a stamped-out spun structure and end in the region of the six plug contacts 4 in through-openings 13 (see also FIG. 2) in the motherboard 1. Four of the conductor tracks 2 lead to the potentiometer and are connected to the printed tracks 3. A motor contact board 12, which forms the third region of the motherboard 1, is integrally formed via a weak point 14 on the contact region 11 of the motherboard 1. Two conductor tracks 2 are exposed alongside the weak point 14 and lead from the plug contacts 4 to the motor contact board 12 where, in suitably arranged openings 15, they form the plug contacts 6 for the contact tabs 7 of the motor 8. The exposed regions of the conductor tracks 2 are designed to be elastic.

The motor 8 uses a pinion 16 to drive an actuating element, for example the throttle valve of an engine, which is in turn connected to the potentiometer (not shown). The weak point 14 is used to allow the motor contact board 12 to be mechanically detached from the rest of the motherboard 1 so as to provide greater freedom for the arrangement of the motor 8 during the assembly process, without having to disconnect the electrical connection for this purpose.

Figure 2:
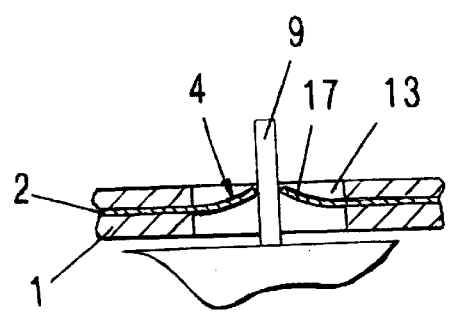
FIGS. 2/3 show a section through the board as shown in FIG. 1, in the region of a plug connection.

The construction of the plug contacts 4, 7 is shown in the cross section illustrated in FIG. 2. This indicates the position of the conductor tracks 2, which are completely embedded by the substrate of the motherboard 1. In the region of the plug contacts 4, the conductor tracks 2 have elastic contact tongues 17 which project from at least two sides into the openings 13. If there are two contact tongues 17, the two contact tongues are located directly opposite one another while, for example, if there are three contact tongues, an offset arrangement at 120° to one another is advantageous. An arrangement of four contact tongues, as in the region of the plug contacts 4, offers the advantage of even better electrical contact.

The distance between the opposite contact tongues 17 is less than the diameter of the contact pins 9 or of the contact tabs 7 of the motor 8. During insertion of a contact pin 9, the contact tongues 17 are thus bent in the manner shown in FIG. 2 until the contact pin 9 can be passed through between the contact tongues 17. The elasticity of the contact tongues 17 in this case results in their ends making very firm contact with the outside of the contact pin 9. The edge of the contact tongues 17 makes an angle with the contact pin 9. If the contact pin 9 is pulled backward, no relative movement is possible between the contact tongues 17 and the surface of the contact pin, and the edges of the contact tongues cut into the surface. The contact point thus has a secure clamping effect which prevents the plug 5 from being able to fall out of the plug contacts 4 if vibration occurs. When temperature fluctuations occur, the elasticity of the contact tongues 17 ensures that temperature-dependent material expansion is compensated for, and cannot lead to deterioration or destruction of the contact point. There is no need to solder the contact surfaces.

In order to reduce the number of contact points and to simplify the assembly process further, electrical components such as an electrical inductor for radio interference suppression of the motor can be integrated in the motor contact board 12. Brush guide channels for the motor 8 can also be provided without any problems in the motor contact board 12 itself.

Figure 3:
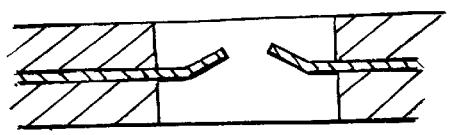

FIG. 3 shows another option where the tongues 17 are bent in advance before the insertion of the contact pins 9, in order to achieve a simplification of the assembly process with this refinement.

I claim:

1. An electrical connection interconnecting a potentiometer, a motor, and control electronics, wherein the motor is operated by the control electronics to drive an actuating element to a position that is detected by the potentiometer, the electrical connection comprising:

an integral board having a substrate supporting tracks of the potentiometer and conductor tracks embedded in the substrate, the integral board including a contact board of the motor, the integral board being provided with a contact region having contact points extending from individual ones of the conductor tracks for engaging with contact tabs of the motor to make electrical connection therewith and for engaging with a plug of the control electronics to make electrical connection therewith; and wherein at the contact points, and openings are formed in the integral board into which openings the conductor tracks project elastically in the form of contact tongues from at least two opposite sides of an opening, with distance between ends of the contact tongues being less than the diameter or the width of a pin of the plug to be inserted or of said contact tabs to be inserted.

2. The electrical connection as claimed in claim 1, wherein the motor and the potentiometer and the control electronics operate in a control loop for driving the motor, and there are components of the control loop which are integrated on the integral board.

3. The electrical connection as claimed in claim 1, wherein the tracks (3) of the potentiometer are applied to the board (1) by printing and are connected to the embedded conductor tracks (2).

4. The electrical connection as claimed in claim 1, wherein the conductor tracks (2) are composed of different materials in their individual regions.

5. The electrical connection as claimed in claim 1, wherein the integral board (1) has a weak point (14) between a motor region (12) and a potentiometer region (10) of the integral board, and the conductor tracks (2) which connect the two parts are exposed and flexible in the region of the weak point (14).

6. The electrical connection as claimed in claim 1, wherein the board (1) has brush guide channels for the motor (8) in region of the motor (8).

* * * * *